(12) United States Patent
Kishi et al.

(10) Patent No.: US 8,940,198 B2
(45) Date of Patent: Jan. 27, 2015

(54) CONDUCTIVE ADHESIVE, AND CIRCUIT BOARD AND ELECTRONIC COMPONENT MODULE USING THE SAME

(75) Inventors: Arata Kishi, Nara (JP); Naomichi Ohashi, Hyogo (JP); Atsushi Yamaguchi, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 154 days.

(21) Appl. No.: 13/240,043

(22) Filed: Sep. 22, 2011

(65) Prior Publication Data
US 2012/0073869 A1 Mar. 29, 2012

(30) Foreign Application Priority Data

Sep. 29, 2010 (JP) .................... 2010-218708
Aug. 3, 2011 (JP) .................... 2011-169966

(51) Int. Cl.
*H01B 1/02* (2006.01)
*C09J 9/02* (2006.01)
*C09J 11/04* (2006.01)
(Continued)

(52) U.S. Cl.
CPC .. *C09J 9/02* (2013.01); *C09J 11/04* (2013.01); *H05K 3/321* (2013.01); *H01L 24/13* (2013.01); *C08K 3/08* (2013.01); *H05K 3/12* (2013.01); *H05K 3/4069* (2013.01); *H05K 2201/0272* (2013.01); *H05K 2203/0425* (2013.01); *H01L 2224/13313* (2013.01); *H01L 2224/81874* (2013.01); *H01L 23/49811* (2013.01); *H01L 21/4853* (2013.01); *H01L 24/16* (2013.01); *H01L 24/81* (2013.01); *H01L 2224/81192* (2013.01); *H01L 2224/8122* (2013.01); *H01L 2224/1329* (2013.01); *H01L 2224/16227* (2013.01); *H01L 2924/00013* (2013.01); *C08K 5/09* (2013.01); *H01L 2224/16225* (2013.01)
USPC ..................................... 252/520.1

(58) Field of Classification Search
CPC ............. H01L 2924/00014; H01L 2924/0105; H01L 2924/01047; H01L 2924/01029; H01L 2924/0132
USPC .............................. 252/519.13, 519.21, 520.1
See application file for complete search history.

(56) References Cited

U.S. PATENT DOCUMENTS 5,874,197 A * 2/1999 Felten .................... 430/281.1
6,010,577 A * 1/2000 Bristol et al. .................... 148/23

(Continued)

FOREIGN PATENT DOCUMENTS

JP 2006-199937 A 8/2006

OTHER PUBLICATIONS

Nakach, M., et al., "Comparison of various milling technologies for grinding pharmaceutical powders," Int. J. Miner. Process. 74S (2004) S173-S181.*

*Primary Examiner* — Mark Kopec
*Assistant Examiner* — William Young
(74) *Attorney, Agent, or Firm* — RatnerPrestia

(57) ABSTRACT

A conductive adhesive includes 10 to 90 wt % of Sn—Bi system solder powder and the remainder of an adhesive containing organic acid, and the Sn—Bi system solder powder is composed of solder particles having a particle size $L_1$ of 20 to 30 μm and solder particles having a particle size $L_2$ of 8 to 12 μm, and a mixing ratio of the Sn—Bi system solder powder is such that the solder particles having a particle size of 20 to 30 μm occupy 40 to 90 wt % with respect to the whole solder powder, and the remainder is occupied by solder particles having a particle size of 8 to 12 μm.

3 Claims, 4 Drawing Sheets

(51) Int. Cl.
  *H05K 3/32* (2006.01)
  *H01L 23/00* (2006.01)
  *C08K 3/08* (2006.01)
  *H05K 3/12* (2006.01)
  *H05K 3/40* (2006.01)
  *H01L 23/498* (2006.01)
  *H01L 21/48* (2006.01)
  *C08K 5/09* (2006.01)

(56) References Cited

U.S. PATENT DOCUMENTS

| | | | |
|---|---|---|---|
| 2005/0126339 A1* | 6/2005 | Shimizu et al. | 75/331 |
| 2007/0277909 A1* | 12/2007 | Tsukahara et al. | 148/24 |
| 2008/0179383 A1* | 7/2008 | Sakurai et al. | 228/208 |
| 2008/0291634 A1* | 11/2008 | Weiser et al. | 361/708 |
| 2009/0301607 A1* | 12/2009 | Nakano et al. | 148/24 |

* cited by examiner

1

CONDUCTIVE ADHESIVE, AND CIRCUIT BOARD AND ELECTRONIC COMPONENT MODULE USING THE SAME

BACKGROUND OF THE INVENTION

1. Field of the Invention

The present invention relates to a conductive adhesive that is used, mainly in soldering an electronic component or the like to an electronic circuit board, and a circuit board and an electronic component module using the same.

2. Related Art

As a method of soldering an electronic component, a reflow soldering method, a flow soldering method and the like are known, and in recent years, a reflow soldering method is employed for surface mounting of an IC chip, a QFP (Quad Flat Package) and the like because it is less likely to generate a bridge between components and between leads and is excellent in productivity. Usually, in the reflow soldering method, a solder paste prepared by mixing powder of a solder alloy and a flux is used, and the solder paste is printed in a predetermined position on an electronic circuit board using a metal mask, followed by heating in a reflow furnace to achieve soldering.

A Sn—Bi system low-melting-point solder is one of the solders of solder pastes that are used in reflow soldering. In this specification, the solder paste means a material composed of (1) solder powder, and (2) a flux composed of organic acid or rosin for removing an oxide film formed on the surface of solder particles or a metal surface on which the solder paste is to be applied, a solvent, and a thicking agent.

However, in the Sn—Bi system solder, there is a problem that it can be used only in some electronic devices because the solder is fragile.

Especially, in a mobile system such as a mobile phone or a digital camera, improvement in joining strength is demanded because cracking occurs or dropout of a soldered component occurs due to the influence on the joined part by an impact or a vibration from outside by falling or the like during use.

For improving the joining strength, as a joining material alternative to solder, a conductive adhesive prepared by mingling solder powder and an epoxy system adhesive with a flux effect as described in Japanese Patent Application Laid-Open No. 2006-199937 (Patent Document 1) is recently developed.

In this specification, the conductive adhesive means a material composed of solder powder, epoxy resin, a curing agent, organic acid, and a thicking agent.

Such a conductive adhesive is a material that provides joining between an electronic circuit board and a component and enhancement simultaneously in such a manner that it is heated by reflow after being printed in a predetermined position in an electronic circuit board by using a metal mask, and after removal of an oxide film of solder by action of organic acid contained in an epoxy system adhesive with a flux effect, joining by a solder and curing of resin occur.

The constitution of the conductive adhesive disclosed in Patent Document 1 is a conductive adhesive prepared by mixing an epoxy system adhesive with a flux effect, and Sn—Bi system solder powder. Here, the epoxy system adhesive with a flux effect disclosed in Patent Document 1 means an epoxy system resin containing a curing agent and organic acid.

In Patent Document 1, Sn42/Bi58(42 weight % Sn-58 weight % Bi) solder powder having a particle size of 25 to 45 µm is used because as for the particle size of the Sn—Bi system solder powder, when the particle diameter is too small, excellent particle junction is not obtained, whereas when the particle size is too large, excellent printing of a land part of a circuit board having a fine pitch is not achieved.

When such a conductive adhesive is used for mounting of a chip component to an electronic circuit board, after printing the conductive adhesive in a predetermined position by a metal mask or the like, and mounting the chip component, the solder powder is melted by heating.

Here, the conductive adhesive releases the adhesive as a result of melting of the solder. The solder wets to the metal of the soldering part, and achieves solder junction, and the adhesive forms a resin film in such a manner that it covers the periphery of the solder. The resin film starts curing at the same time with melting of the solder by its heat, and the curing completes after end of the soldering.

In the conductive adhesive of Patent Document 1, for achieving smooth progression from solder melting to wetting to the metal part (solder cohesiveness) at the time of soldering, namely, for improving the solubility of organic acid in the epoxy resin or the mixture with the curing agent, dibasic acid having an alkyl group in a side chain is used as the organic acid. It is also described that this organic acid uses 2,5-diethyladipic acid, and the number of carbons of the straight chain is 6 or more, and as the alkyl group of the side chain, an alkyl group having 1 to 5 carbon(s) is used.

SUMMARY OF THE INVENTION

However, in the aforementioned conductive adhesive of Patent Document 1, although the ability of ensuring the printing performance of the conductive adhesive to a board for such a fine pitch of 0.8 mm is disclosed, it is difficult to ensure the printing performance for a much finer pitch smaller than 0.8 mm.

Taking such a problem of the conventional conductive adhesive into account, the present invention is directed to a conductive adhesive capable of ensuring the printing performance for a circuit board having a land of a much finer pitch smaller than that of conventional ones, and a circuit board and an electronic component module using the same.

The $1^{st}$ aspect of the present invention is a conductive adhesive comprising:

10 to 90 wt % of Sn—Bi system solder powder and; the remainder of an adhesive containing organic acid, wherein the Sn—Bi system solder powder is composed of solder particles having a particle size $L_1$ of 20 to 30 µm and solder particles having a particle size $L_2$ of 8 to 12 µm, and a mixing ratio of the Sn—Bi system solder powder is such that the solder particles having a particle size of 20 to 30 µm occupy 40 to 90 wt % with respect to the whole solder powder, and the remainder is occupied by solder particles having a particle size of 8 to 12 µm.

The $2^{nd}$ aspect of the present invention is a conductive adhesive comprising:

10 to 90 wt % of Sn—Bi system solder powder and; the remainder of an adhesive containing organic acid, wherein the Sn—Bi system solder powder is composed of solder particles having a particle size $L_1$ of 20 to 30 µm and solder particles having a particle size $L_2$ of 8 to 12 µm, and a mixing ratio of the Sn—Bi system solder powder is such that the solder particles having a particle size of 20 to 30 µm occupy 60 to 80 wt % with respect to the whole solder powder, and the remainder is occupied by solder particles having a particle size of 8 to 12 µm.

The $3^{rd}$ aspect of the present invention is the conductive adhesive according to the $1^{st}$ aspect of the present invention, wherein the adhesive containing organic acid is composed of at least an epoxy resin, a curing agent, the organic acid, and a thicking agent, and the organic acid includes adipic acid and glutaric acid.

The 4$^{th}$ aspect of the present invention is the conductive adhesive according to the 3$^{rd}$ aspect of the present invention, wherein a ratio between the adipic acid and the glutaric acid is such that the adipic acid occupies 10 to 50 wt %, and the remainder is occupied by the glutaric acid.

The 5$^{th}$ aspect of the present invention is the conductive adhesive according to the 4$^{th}$ aspect of the present invention, wherein a ratio between the adipic acid and the glutaric acid is such that adipic acid occupies 20 to 40 wt %, and the remainder is occupied by the glutaric acid.

The 6$^{th}$ aspect of the present invention is the conductive adhesive according to the 3$^{rd}$ aspect of the present invention, wherein in a particle size distribution of the organic acid, an amount of particles having a particle size of 10 μm or less occupies 5 to 70% with respect to the whole particles of the organic acid.

The 7$^{th}$ aspect of the present invention is the conductive adhesive according to the 1$^{st}$ aspect of the present invention, wherein a solder composition of the Sn—Bi system solder powder is 42 weight % Sn-58 weight % Bi, 42 weight % Sn-57 weight % Bi-1.0 weight % Ag, or 16 weight % Sn-56 weight % Bi-28 weight % In.

The 8$^{th}$ aspect of the present invention is a conductive adhesive comprising:

10 to 90 wt % of Sn—Bi system solder powder and;

the remainder of an adhesive containing organic acid, wherein the Sn—Bi system solder powder is composed of solder particles having a particle size $L_1$ of 20 to 30 μm and solder particles having a particle size $L_2$ of 8 to 12 μm, a mixing ratio of the Sn—Bi system solder powder is such that the solder particles having a particle size of 20 to 30 μm occupy 60 to 80 wt % with respect to the whole solder powder, and the remainder is occupied by solder particles having a particle size of 8 to 12 μm, the adhesive containing organic acid is composed of at least an epoxy resin, a curing agent, the organic acid, and a thicking agent, the organic acid includes adipic acid and glutaric acid, and a ratio between the adipic acid and the glutaric acid is such that the adipic acid occupies 20 to 40 wt % of the whole organic acid, and the remainder is occupied by the glutaric acid.

The 9$^{th}$ aspect of the present invention is the conductive adhesive according to the 1$^{st}$ aspect of the present invention, wherein the particle size $L_2$ is 0.4 times the particle size $L_1$.

The 10$^{th}$ aspect of the present invention is a circuit board comprising:

a base plate; and a conductive part formed on the base plate using the conductive adhesive according to the 1$^{st}$ aspect of the present invention.

The 11$^{th}$ aspect of the present invention is an electronic component module comprising:

a circuit board;

a conductive part formed on the circuit board using the conductive adhesive according to the 1$^{st}$ aspect of the present invention; and an electronic component mounted on the circuit board via the conductive part.

The 12$^{th}$ aspect of the present invention is the conductive adhesive according to the 2$^{nd}$ aspect of the present invention, wherein the adhesive containing organic acid is composed of at least an epoxy resin, a curing agent, the organic acid, and a thicking agent, and the organic acid includes adipic acid and glutaric acid.

The 13$^{th}$ aspect of the present invention is the conductive adhesive according to the 12$^{th}$ aspect of the present invention, wherein a ratio between the adipic acid and the glutaric acid is such that the adipic acid occupies 10 to 50 wt %, and the remainder is occupied by the glutaric acid.

The 14$^{th}$ aspect of the present invention is the conductive adhesive according to the 13$^{th}$ aspect of the present invention, wherein a ratio between the adipic acid and the glutaric acid is such that adipic acid occupies 20 to 40 wt %, and the remainder is occupied by the glutaric acid.

The 15$^{th}$ aspect of the present invention is the conductive adhesive according to the 12$^{th}$ aspect of the present invention, wherein in a particle size distribution of the organic acid, an amount of particles having a particle size of 10 μm or less occupies 5 to 70% with respect to the whole particles of the organic acid.

The 16$^{th}$ aspect of the present invention is the conductive adhesive according to the 2$^{nd}$ aspect of the present invention, wherein a solder composition of the Sn—Bi system solder powder is 42 weight % Sn-58 weight % Bi, 42 weight % Sn-57 weight % Bi-1.0 weight % Ag, or16 weight % Sn-56 weight % Bi-28 weight % In.

The 17$^{th}$ aspect of the present invention is the conductive adhesive according to the 2$^{nd}$ aspect of the present invention, wherein the particle size $L_2$ is 0.4 times the particle size $L_1$.

The 18$^{th}$ aspect of the present invention is a circuit board comprising:

a base plate; and a conductive part formed on the base plate using the conductive adhesive according to the 2$^{nd}$ aspect of the present invention.

The 19$^{th}$ aspect of the present invention is an electronic component module comprising:

a circuit board;

a conductive part formed on the circuit board using the conductive adhesive according to the 2$^{nd}$ aspect of the present invention; and an electronic component mounted on the circuit board via the conductive part.

The 20$^{th}$ aspect of the present invention is the conductive adhesive according to the 8$^{th}$ aspect of the present invention, wherein the particle size $L_2$ is 0.4 times the particle size $L_1$.

Advantageous Effects of the Invention

According to the above constitution, by mixing Sn—Bi system solder powders having two kinds of particle sizes, printing to an electronic circuit board having a land of a much finer pitch smaller than 0.8 mm is enabled.

As described above, according to the present invention, it is possible to provide a conductive adhesive capable of ensuring the printing performance for a circuit board having a land of a much finer pitch smaller than conventional ones, and a circuit board and an electronic component module using the same.

Moreover, according to the present invention, in addition to the above effect, it is possible to provide a conductive adhesive, capable of allowing smooth progression of wetting to a metal part (solder cohesiveness) at the time of solder melting, and ensuring the squeegee life (viscosity stability at the time of printing), and a circuit board and an electronic component module using the same.

DESCRIPTION OF PREFERRED EMBODIMENTS

Figure 1:
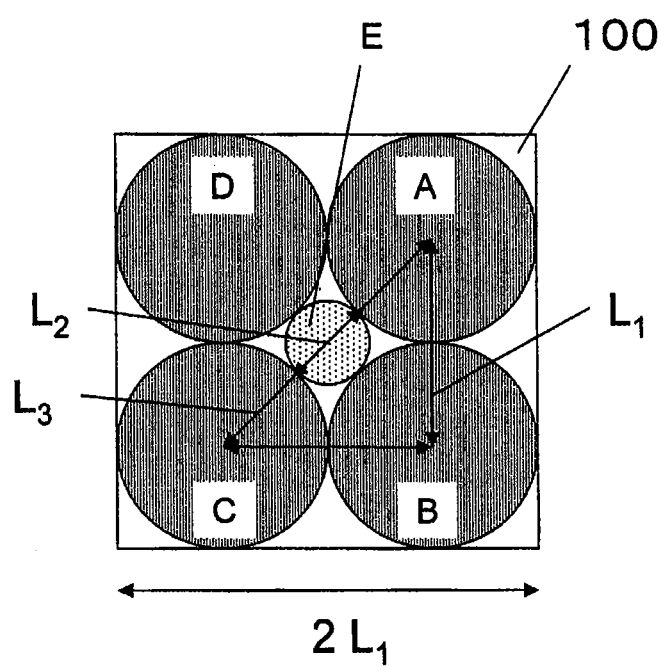
FIG. 1 is a schematic view for describing particle sizes of solder particles of a conductive adhesive in an embodiment of the present invention.

Embodiments of the present invention will be described below.

Here, the items (material names, evaluation methods) common to the later-described embodiments will be described collectively in advance.

A conductive adhesive in embodiments of the present invention is composed of an adhesive containing organic acid and Sn—Bi system solder powder.

The "adhesive containing organic acid" in embodiments of the present invention has a flux effect (here, the flux effect means an effect of removing an oxide film generated on a metal surface to which the conductive adhesive is to be applied, and an effect of reducing the surface tension of the molten solder to promote the wettability to the joined metal surface to be soldered).

The Sn—Bi system solder particles are characterized in that two kinds of particle sizes, namely solder particles having a particle size $L_1$ of 20 to 30 μm, and solder particles having a particle size $L_2$ of 8 to 12 μm are mixed.

The adhesive containing organic acid is composed of at least an epoxy resin, a curing agent, organic acid, and a thicking agent, and the organic acid is concretely mixture of both adipic acid and glutaric acid.

The materials used in Examples and Comparative examples as will be described later are prepared or obtained in the following manners.

(1) Preparation of Materials for Conductive Adhesives a) Solder particles: Mixture of the following solder particles No. 1 and No. 2 was used.

Particle sizes of the solder particles No 1 and No. 2 are measured by a laser diffraction and scattering method, and represented by a median diameter (D50) which is a particle size where the integrated particle amount is 50%.

a-1) Sn—Bi system solder particles No. 1 (particle size of 20 to 30 μm)

Product name: Sn/Bi58 (20-30) (available from MITSUI MINING & SMELTING CO., LTD)

a-2) Sn—Bi system solder particles No. 2 (particle size of 8 to 12 μm)

Product name: Sn/Bi58 (DS10) (available from MITSUI MINING & SMELTING CO., LTD)

The particle size used herein represents a diameter when the one particle is spherical, while for other shape, it represents the maximum length of a circumscribed rectangular parallelepiped of the shape.

b) Epoxy Resin:

b-1) Bisphenol A type epoxy resin

Product name: EPICOAT YL980 (available from Japan Epoxy Resin Co., Ltd.)

b-2) Bisphenol F type epoxy resin

Product name: EPICOAT 806 (available from Japan Epoxy Resin Co., Ltd.)

c) Curing Agent:

Imidazole system curing agent (powder of 10 μm or less)

Product name: 2P4 MHZ (2-phenyl-4-methyl-5-hydroxymethylimidazole: available from SHIKOKU CHEMICALS CORPORATION)

d) Organic acid:

d-1) Adipic acid (available KANTO CHEMICAL CO., INC)

d-2) Glutaric acid (available KANTO CHEMICAL CO., INC)

e) Thickener: Dibenzylidene Sorbitol

Product name: GEL ALL D (available from New Japan Chemical Co., Ltd.)

Using these materials, a conductive adhesive composed of an adhesive containing organic acid and Sn—Bi system solder powder was prepared according to the following formulation.

Bisphenol A type epoxy resin, bisphenol F type epoxy resin, an imidazole system curing agent, adipic acid, glutaric acid, and a thicking agent were weighed, and stirred in an environment of 18° C. to 28° C. for about 30 minutes until the entirety was uniform, to prepare an adhesive containing organic acid.

Next, the adhesive containing organic acid obtained in the above stirring step was added with arbitrary amounts of solder particles of two kinds of particle sizes, and stirred in an environment of 18° C. to 28° C. for about 120 minutes until the entirety was uniform by means of a dispersing device such as a stirrer, a stone mill, a triple rollers, or a planetary mixer, to prepare a conductive adhesive. Evaluation of product quality for each of Examples and Comparative examples was conducted in the procedures of (2) to (4) below.

(2) Evaluation Method of Printing Performance

As to the printing performance, evaluation was conducted in the following manner.

In brief, in the later-described embodiments of the present invention, presence or absence of a bridge and presence or absence of a crack were observed by printing of a conductive adhesive using a metal mask, and acceptance or rejection in the printing performance was determined based on combination of the both results of the bridge and the crack. Here, the bridge means a part that connects between neighboring applied parts of the conductive adhesive, and the crack means an unapplied part occurring in the part where the conductive adhesive should be applied.

Printing of the conductive adhesive was conducted with a printer using two kinds of masks, that is, a first metal mask having a thickness of 0.12 mm and rectangular openings (3 mm×0.25 mm) formed thereon at intervals of a 0.4 mm pitch, and a second metal mask having a thickness of 0.12 mm and the identical rectangular openings (3 mm×0.25 mm) formed thereon at intervals of a 0.3 mm pitch, and then the printed shapes were observed under a microscope. The magnification of the microscope at this time was 150 times.

The first metal mask having 0.4 mm pitch intervals was used because acceptance or rejection of printing is intended to be evaluated for an electronic circuit board having a land of a fine pitch.

The second metal mask having 0.3 mm pitch intervals was used for evaluating determination of acceptance or rejection of printing for an electronic circuit board having a land of a finer pitch.

By the printing using the metal masks, presence or absence of a bridge and presence or absence of a crack were observed, and acceptance or rejection in printing performance was determined based on combination of the both results as will be described below.

a) Presence or Absence of a Bridge:

When a bridge did not occur in both of the printing results using the first metal mask and the second metal mask, the mark ⊚ (the mark meaning acceptance) was added. When a bridge did not occur only in the printing result using the first metal mask, the mark ○ (the mark meaning acceptance) was added (a bridge occurred only in the printing result using the second metal mask).

When a bridge occurred in the printing result using the first metal mask, the mark x (the mark meaning rejection) was added.

b) Presence or Absence of a Crack:

When a crack did not occur both in the printing results using the first metal mask and the second metal mask, the mark ⊚ (the mark meaning acceptance) was added. When a crack did not occur only in the printing result using the first metal mask, the mark ○ (the mark meaning acceptance) was added (a crack occurred only in the printing result using the second metal mask).

When a crack occurred in the printing result using the first metal mask (for example, the one with a small amount of solder), the mark x (the mark meaning rejection) was added.

c) Evaluation of Printing Performance

When both of the evaluation results of the two items a) and b) described above were marked with ○, the mark ○ was added as an evaluation of printing performance, and it was determined as "acceptance". When both of the evaluation results of the two items a) and b) as described above were marked with ⊚, the mark ⊚ was added as an evaluation of printing performance, and it was determined that printing is possible with a much finer pitch than the case marked with ○. When either one of the evaluation results of the two items a) and b) described above was marked with x, the mark x was added as an evaluation of printing performance.

(3) Evaluation of Solder Cohesiveness (Evaluation of Cohesiveness)

In conformance with JIS (Japanese Industrial Standard) Z3197, using a third metal mask having a circular opening with a diameter of 0.3 mm (the size of the circular opening is represented by ϕ0.3 mm) or a square opening with one side of 0.3 mm (the size of the square opening is represented by □0.3 mm) and a fourth metal mask having a circular opening with a diameter of 0.1 mm (the size of the circular opening is ϕ0.1 mm) or a square opening with one side of 0.1 mm (the size of the square opening is represented by □0.1 mm) as two kinds of metal masks having different sizes of openings, a generating amount of solder balls on the solder ceramic substrate was examined.

When a solder particle in any state regardless of cohering or not was not present in the vicinity of the cohered solder particles on each land on the ceramic substrates using the third metal mask and on each land on the ceramic substrates using the fourth metal mask, the mark ⊚ (the mark meaning acceptance) was added. When a solder particle in any state regardless of cohering or not was not present in the vicinity of the cohered solder particles only on each land of the ceramic substrate using the third metal mask, the mark ○ (the mark meaning acceptance) was added (a solder particle in any state was present in the vicinity of the cohered solder particles only in the result using the fourth metal mask).

When a solder particle in any state was present in the vicinity of the cohered solder particles on each land on the ceramic substrate using the third metal mask, the mark x (the mark meaning rejection) was added.

(4) Evaluation of Squeegee Life (Viscosity Measuring Method of Conductive Adhesive)

Using a type E viscometer, viscosity when a rotor was revolved at 0.5 rpm, or 5 rpm in an atmosphere of 25° C. was measured. A value of viscosity at 5 rpm was taken as a representative value.

After measuring an initial viscosity prior to a squeezing test of a conductive adhesive ($\sigma_0$: 5 rpm) with a type E viscometer, the conductive paste was subjected to a squeezing test (the conductive adhesive was rolled for a predetermined time by a printing machine) in an atmosphere of 25±1° C. using a printing machine, and viscosity after 24 hours ($\sigma_{24}$: 5 rpm) was measured. Based on a value of $\sigma_{24}/\sigma_0$ ratio, the degree of thickening of the conductive adhesive was evaluated.

When the value of $\sigma_{24}/\sigma_0$ was 1 to 1.2 or less, it was determined as acceptance (indicated by ○), and when it was more than 1.2, it was determined as rejection (indicated by x).

First Embodiment Ratio between Sn—Bi System Solder Particles No. 1 and Sn—Bi System Solder Particles No. 2

In the first embodiment, particle sizes and a mixing ratio of Sn—Bi system solder powder were examined.

First, a blending ratio of the adhesive containing organic acid used in the present embodiment will be described, and then preparation of a conductive adhesive using the same will be described.

In brief, 16 wt % of bisphenol A type epoxy resin, 62 wt % of bisphenol F type epoxy resin, 12 wt % of imidazole system curing agent, 3.0 wt % of adipic acid, 6.0 wt % of glutaric acid, and 1.0 wt % of a thicking agent were weighed, and stirred in an environment of 18° C. to 28° C. for about 30 minutes until the entirety was uniform, to prepare an adhesive containing organic acid.

Then, with respect to 18 wt % of the adhesive containing organic acid obtained in the above stirring step, the remainder of 82 wt % was occupied by Sn—Bi system solder particles, and a desired conductive adhesive was prepared while varying the ratio between Sn—Bi system solder particles No. 1 and Sn—Bi system solder particles No. 2 in the Sn—Bi system solder particles, and the printing performance was evaluated (see Table 1).

At this time, the composition of the Sn—Bi system solder particles was Sn42/Bi58 (42 weight % Sn-58 weight % Bi).

As to the solder particle size, an optimum ratio was derived by calculating a particle size ratio and varying the blending ratio based on the following thought.

In recent years, as the high-density mounting progresses in various electrical machineries and apparatuses, the electronic component is miniaturized, and the pitch of the intervals of arranging the electronic components is narrowed. In association with this, a soldering area is further narrowed.

Here, the conductive adhesive composed of an adhesive containing organic acid and solder particles can provide sufficient soldering strength by virtue of the enhancing effect by resin even when the soldering area is narrowed, because it covers the periphery of the solder with the resin after soldering.

Applying these to necessary conditions during use of materials, the printing performance for the electronic circuit board having a land of a fine pitch is demanded. As a measure for solving this problem, it is requested to reduce the solder particle size, however, cohesiveness at the time of solder melting is problematic. This is because when the solder particle size is small, the substantial surface area of the whole solder particles increases and an oxide film increases.

Further, when the solder particle size is large, a bridge is likely to occur when a land pattern of a 0603 chip component, a 0402 chip component or the like is printed.

Therefore, regarding the solder particle size which is to be a basis, it was revealed that a solder particle size of 20 to 30 μm enables the conductive adhesive to ensure excellent printing performance on a land pattern.

On the other hand, in the 0603 chip component and the 0402 chip component, one side of the opening of the metal mask was 0.3 mm and 0.2 mm respectively, and in the case of solder particles exceeding 30 μm, a required amount of the conductive adhesive was not printed onto the land.

As a result of repeated studies, we decided to mix solder particles having a particle size of 8 to 12 μm to solder particles having a particle size of 20 to 30 μm.

The reason why the solder particles of two kinds of particle sizes are mixed as described above is because we thought that it is important to fill the adhesive containing organic acid with the solder particles without any gaps for achieving the printing performance to an electronic circuit substance having a land of a fine pitch.

Now selection of these particle sizes will be further described with reference to FIG. 1.

FIG. 1 is a view showing a imaginary model for easy of understanding, wherein all of the four solder particles having larger particle sizes are assumed to have the same diameter ($L_1$).

As shown in FIG. 1, representing the four solder particles having larger particle sizes by A, B, C and D, the diameter of these by $L_1$, the solder particles having a smaller particle size by E, the diameter thereof by $L_2$, and a distance between A and C by $L_3$, the following relations are established (see Expression 1). Other sites than the solder particles A to E are gaps of 100, and are filled with resin or the like.

$$L_3 = \sqrt{2} \times L_1$$

$$L_2 = L_3 - L_1 \approx 0.4 L_1 \quad \text{[Expression 1]}$$

Assigning 20 μm, 25 μm, and 30 μm to $L_1$ of the diameter of the solder particles A, B, C and D on the right side of the second formula in the above (Expression 1), $L_2$ is calculated to be 8.0 μm, 10 μm, and 12 μm, respectively.

Taking a hint from the examination result according to the above imaginary model, we expected that printing to an electronic circuit substance having a land of a fine pitch is enabled by mixing solder particles having a solder particle size of 8 to 12 μm to solder particles having a solder particle size of 20 to 30 μm, and examined the relation between a mixing ratio of these solder particles and the printing performance.

Here, how the above (Expression 1) concerns in mixing solder particles of different particle sizes will be further described.

In the present embodiment, as described above, a median diameter (D50) which is a particle size where the integrated particle amount is 50% is used as a particle size. Therefore, the solder particles having a particle size of 20 μm also include particles having a particle size of 30 μm based on the particle size distribution, so that even when they are combined with solder particles having a particle size of 12 μm, there are particles that satisfy the relation as described above (Expression 1).

Further, solder particles having a particle size of 30 μm also include particles having a particle size of 20 μm based on the particle size distribution, so that even when they are combined with solder particles having a particle size of 8.0 μm, there are particles that satisfy the relation as described above (Expression 1).

From these, inventors of the present application expected that the capability of printing on a land of a fine pitch which is an effect of the present invention is realized as long as the two kinds of particle sizes represented by median diameter fall within the range of 20 to 30 μm and the range of 8 to 12 μm, respectively, regardless of the combination of the solder particles of such two kinds of particle sizes.

Blending ratios of conductive adhesives prepared in Examples 1 to 15 and Comparative examples 1 to 12, and evaluation results of the printing performance are shown in Tables 1 to 3.

Herein, the numerical values in the fourth to fifth blocks from above in Tables 1 to 3 show weight percentages representing a blending ratio of the solder particles.

TABLE 1

| | | Example 1 | Example 2 | Example 3 | Example 4 | Example 5 | Comparative example 1 | Comparative example 2 | Comparative example 3 | Comparative example 4 |
|---|---|---|---|---|---|---|---|---|---|---|
| Ration between adhesive containing organic acid, and solder particles | Adhesive containing organic acid (wt %) | 18 | 18 | 18 | 18 | 18 | 18 | 18 | 18 | 18 |
| | Solder particles (wt %) | 82 | 82 | 82 | 82 | 82 | 82 | 82 | 82 | 82 |
| Ration of solder particles | Solder particles No. 1 (particle size of 20 to 30 μm) (wt %) | 40 | 60 | 70 | 80 | 90 | 100 | 0 | 35 | 95 |
| | Solder particles No. 2 (particle size of 8 to 12 μm) (wt %) | 60 | 40 | 30 | 20 | 10 | 0 | 100 | 65 | 5 |
| Evaluation results | Presence or absence of a bridge | ○ | ⊙ | ⊙ | ⊙ | ○ | X | ○ | ○ | X |
| | Presence or absence of a crack | ○ | ⊙ | ⊙ | ⊙ | ○ | ○ | X | X | ○ |

TABLE 1-continued

|  | Example 1 | Example 2 | Example 3 | Example 4 | Example 5 | Comparative example 1 | Comparative example 2 | Comparative example 3 | Comparative example 4 |
|---|---|---|---|---|---|---|---|---|---|
| Evaluation of printing performance | ○ | ◎ | ◎ | ◎ | ○ | X | X | X | X |

Note)
As to Evaluation of printing performance
Mark ○: When both of the evaluation results of the "presence or absence of a bridge" and "presence or absence of a crack" shown in the above Table were marked with ○, the Mark ○ was added as Evaluation of printing performance.
Mark ◎: When both of the evaluation results of the "presence or absence of a bridge" and "presence or absence of a crack" shown in the above Table were marked with ◎, the Mark ◎ was added as Evaluation of printing performance.

As shown in Table 1, in Examples 1 to 5, the ratio between solder particles No. 1 and solder particles No. 2 was varied, and the printing performance was evaluated using a first metal mask, and as a result, no bridge and crack occurred, and hence we determined as acceptance.

Further, in Examples 1 to 5, the printing performance was evaluated using a second metal mask, and as a result, no bride and crack occurred in Examples 2 to 4, and hence we determined as acceptance (see the mark ◎ in Table 1).

In other words, when the proportion of solder particles No. 1 was 40 to 90 wt %, and the remainder was occupied by solder particles No. 2, the printing performance was able to be ensured when the first metal mask was used.

When the proportion of solder particles No. 1 was 60 to 80 wt %, and the remainder was occupied by solder particles No. 2, the printing performance was able to be ensured when the first metal mask and the second metal mask was used (see the mark ◎ in Table 1).

Next, a conductive adhesive was prepared only with solder particles No. 1, and the printing performance was evaluated, and we determined as rejection because a bridge occurred (see Comparative example 1 in Table 1).

On the contrary, when a conductive adhesive was prepared only with solder particles No. 2, a bridge did not occur, however, at the time of removing the metal mask after printing, a part of the printed conductive adhesive adhered to an edge part of the opening of the metal mask and a crack occurred, so we determined as rejection (see Comparative example 2 in Table 1).

Further, for examining the ratio between solder particles No. 1 and solder particles No. 2 more specifically, a conductive adhesive in which 35 wt % of solder particles No. 1 and 65 wt % of solder particles No. 2 were blended was prepared, and the printing performance was evaluated. As a result, a bridge did not occur, but a crack occurred, and hence we determined as rejection (see Comparative example 3 in Table 1).

On the contrary, when solder particles No. 1 are supplied excessively, and the printing performance was evaluated, a crack did not occur, but a bridge occurred, and hence we determined as rejection (see Comparative example 4 in Table 1).

In Tables 2 and 3, the mixing ratio between the adhesive containing organic acid and the solder particles was varied while making each of the ratios between solder particles No. 1 and solder particles No. 2 into coincidence with each of the examples of Table 1, and the printing performance was evaluated.

In other words, the weight ratio between the adhesive containing organic acid and the solder particles contained in the conductive adhesive was varied.

As shown in Table 2, with respect to 10 wt % of the adhesive containing organic acid, the remainder of 90 wt % was occupied by the solder particles, and a desired conductive adhesive was prepared while varying the ratio between Sn—Bi system solder particles No. 1 and Sn—Bi system solder particles No. 2, and the printing performance was evaluated.

TABLE 2

|  |  | Example 6 | Example 7 | Example 8 | Example 9 | Example 10 | Comparative example 5 | Comparative example 6 | Comparative example 7 | Comparative example 8 |
|---|---|---|---|---|---|---|---|---|---|---|
| Ration between adhesive containing organic acid, and solder particles | Adhesive containing organic acid (wt %) | 10 | 10 | 10 | 10 | 10 | 10 | 10 | 10 | 10 |
|  | Solder particles (wt %) | 90 | 90 | 90 | 90 | 90 | 90 | 90 | 90 | 90 |
| Ration of solder particles | Solder particles No. 1 (particle size of 20 to 30 μm) (wt %) | 40 | 60 | 70 | 80 | 90 | 100 | 0 | 35 | 95 |
|  | Solder particles No. 2 (particle size of 8 to 12 μm) (wt %) | 60 | 40 | 30 | 20 | 10 | 0 | 100 | 65 | 5 |
| Evaluation results | Presence or absence of a bridge | ○ | ◎ | ◎ | ◎ | ○ | X | ○ | ○ | X |
|  | Presence or absence of a crack | ○ | ◎ | ◎ | ◎ | ○ | ○ | X | X | ○ |

TABLE 2-continued

|  | | Example 6 | Example 7 | Example 8 | Example 9 | Example 10 | Comparative example 5 | Comparative example 6 | Comparative example 7 | Comparative example 8 |
|---|---|---|---|---|---|---|---|---|---|---|
|  | Evaluation of printing performance | ○ | ◉ | ◉ | ◉ | ○ | X | X | X | X |

Note)
As to Evaluation of printing performance
Mark ○: When both of the evaluation results of the "presence or absence of a bridge" and "presence or absence of a crack" shown in the above Table were marked with ○, the Mark ○ was added as Evaluation of printing performance.
Mark ◉: When both of the evaluation results of the "presence or absence of a bridge" and "presence or absence of a crack" shown in the above Table were marked with ◉, the Mark ◉ was added as Evaluation of printing performance.

Concretely, in Examples 6 to 10, the printing performance was evaluated using a first metal mask, and as a result, no bridge and crack occurred, and hence we determined as acceptance.

Further, in Examples 6 to 10, the printing performance was evaluated using the second metal mask, and as a result, no bridge and crack occurred in Examples 7 to 9, and hence we determined as acceptance (see the mark ◉ in Table 2.).

Next, a conductive adhesive was prepared only with solder particles No. 1, and the printing performance was evaluated, and we determined as rejection because a bridge occurred (see Comparative example 5 in Table 2).

On the contrary, when a conductive adhesive was prepared only with solder particles No. 2, a bridge did not occur, however, at the time of removing the metal mask after printing, a part of the printed conductive adhesive adhered to an edge part of the opening of the metal mask and a crack occurred, so we determined as rejection (see Comparative example 6 in Table 2).

Further, for examining the ratio between solder particles No. 1 and solder particles No. 2 more specifically, a conductive adhesive in which 35 wt % of solder particles No. 1 and 65 wt % of solder particles No. 2 were blended was prepared, and the printing performance was evaluated. As a result, a bridge did not occur, but a crack occurred, and hence we determined as rejection (see Comparative example 7 in Table 2).

On the contrary, when solder particles No. 1 are supplied excessively, and the printing performance was evaluated, a crack did not occur, but a bridge occurred, and hence we determined as rejection (see Comparative example 8 in Table 2)

Next, as shown in Table 3, with respect to 90 wt % of the adhesive containing organic acid, the remainder of 10 wt % was occupied by the solder particles, and a desired conductive adhesive was prepared while varying the ratio between Sn—Bi system solder particles No. 1 and Sn—Bi system solder particles No. 2, and the printing performance was evaluated.

TABLE 3

|  |  | Example 11 | Example 12 | Example 13 | Example 14 | Example 15 | Comparative example 9 | Comparative example 10 | Comparative example 11 | Comparative example 12 |
|---|---|---|---|---|---|---|---|---|---|---|
| Ration between adhesive containing organic acid, and solder particles | Adhesive containing organic acid (wt %) | 90 | 90 | 90 | 90 | 90 | 90 | 90 | 90 | 90 |
|  | Solder particles (wt %) | 10 | 10 | 10 | 10 | 10 | 10 | 10 | 10 | 10 |
| Ration of solder particles | Solder particles No. 1 (particle size of 20 to 30 μm) (wt %) | 40 | 60 | 70 | 80 | 90 | 100 | 0 | 35 | 95 |
|  | Solder particles No. 2 (particle size of 8 to 12 μm) (wt %) | 60 | 40 | 30 | 20 | 10 | 0 | 100 | 65 | 5 |
| Evaluation results | Presence or absence of a bridge | ○ | ◉ | ◉ | ◉ | ○ | X | ○ | ○ | X |
|  | Presence or absence of a crack | ○ | ◉ | ◉ | ◉ | ○ | ○ | X | X | ○ |
|  | Evaluation of printing performance | ○ | ◉ | ◉ | ◉ | ○ | X | X | X | X |

Note)
As to Evaluation of printing performance
Mark ○: When both of the evaluation results of the "presence or absence of a bridge" and "presence or absence of a crack" shown in the above Table were marked with ○, the Mark ○ was added as Evaluation of printing performance.
Mark ◉: When both of the evaluation results of the "presence or absence of a bridge" and "presence or absence of a crack" shown in the above Table were marked with ◉, the Mark ◉ was added as Evaluation of printing performance.

Concretely, in Examples 11 to 15, the printing performance was evaluated using a first metal mask, and as a result, no bridge and crack occurred, and hence we determined as acceptance.

Further, in Examples 11 to 15, the printing performance was evaluated using the second metal mask, and as a result, no bridge and crack occurred in Examples 12 to 14, and hence we determined as acceptance (see the mark ◉ in Table 3.).

Next, a conductive adhesive was prepared only with solder particles No. 1, and the printing performance was evaluated, and we determined as rejection because a bridge occurred (see Comparative example 9 in Table 3).

On the contrary, when a conductive adhesive was prepared only with solder particles No. 2, a bridge did not occur, however, at the time of removing the metal mask after printing, a part of the printed conductive adhesive adhered to an edge part of the opening of the metal mask and a crack occurred, so we determined as rejection (see Comparative example 10 in Table 3).

Further, for examining the ratio between solder particles No. 1 and solder particles No. 2 more specifically, a conductive adhesive in which 35 wt % of solder particles No. 1 and 65 wt % of solder particles No. 2 were blended was prepared, and the printing performance was evaluated. As a result, a bridge did not occur, but a crack occurred, and hence we determined as rejection (see Comparative example 11 in Table 3).

On the contrary, when solder particles No. 1 are supplied excessively, and the printing performance was evaluated, a crack did not occur, but a bridge occurred, and hence we determined as rejection (see Comparative example 12 in Table 3) [0085]

From this result, it was revealed that a land of a fine pitch (0.4 mm pitch) can be surely printed when the proportion of solder particles No. 1 is 40 to 90 wt %, and the remainder is occupied by solder particles No. 2 in the conductive adhesive of the present invention.

From this result, it was revealed that the case, where the proportion of solder particles No. 1 is 60 to 80 wt % and the remainder is occupied by solder particles No. 2, is more preferred in the conductive adhesive of the present invention because a land of a finer pitch (0.3 mm pitch) can be surely printed.

It seems that this is attributable to the fact that the size of the gap occurring at the time of mingling solder particles No. 1 and the adhesive containing organic acid coincides with the size of solder particles No. 2.

Further, it was revealed that in the conductive adhesive of the present invention, preferably, the proportion of solder particles No. 1 is 60 to 80 wt %, and the remainder is occupied by solder particles No. 2.

It seems that this is attributable to the fact that there is a tendency that focusing on the solder particles having a large particle size, the more the particles having a large particle size exist, the larger the gap is and the more a bridge is likely to occur, while on the other hand, the fewer the particles having a large particle size exist, the more a crack is likely to occur.

From the above result, a ratio in size of solder particles of two kinds of particle sizes for ensuring the printing performance of a land having a much finer pitch than conventional ones is as follows.

Specifically, the ratio in particle size between solder particles No. 1 and solder particles No. 2 is preferably set in the ratio 20 to 30:8 to 12, or generally set in the ratio 5:2, and it was revealed that when the proportion of solder particles No. 1 is 40 to 90 wt % and the remainder is occupied by solder particles No. 2, the printing performance can be ensured.

Further, it was revealed that preferably the proportion of solder particles No. 1 is 60 to 80 wt %, and the remainder is occupied by solder particles No. 2.

Second Embodiment (Ratio of Organic Acid)

In the second embodiment, the organic acid that constitutes the adhesive containing organic acid will be examined. As the organic acid, adipic acid (melting point: 152° C.) and glutaric acid (melting point: 97° C.) were examined.

First, a blending ratio of the adhesive containing organic acid used in the present embodiment will be described, and then preparation of a conductive adhesive using the same will be described.

In brief, 16 wt % of bisphenol A type epoxy resin, 62 wt % of bisphenol F type epoxy resin, 12 wt % of imidazole system curing agent, 9.0 wt % of organic acid (adipic acid and glutaric acid), and 1.0 wt % of a thicking agent were weighed, and stirred in an environment of 18° C. to 28° C. for about 30 minutes until the entirety was uniform, to prepare an adhesive containing organic acid.

Then, with respect to 18 wt % of the adhesive containing organic acid obtained in the above stirring step, the remainder of 82 wt % was occupied by the Sn—Bi system solder particles, and in the Sn—Bi system solder particles, Sn—Bi system solder particles No. 1 occupied 70 wt % and Sn—Bi system solder particles No. 2 occupied 30 wt %, to prepare a desired conductive adhesive, and evaluation of solder cohesiveness and evaluation of squeegee life were executed (see Table 4).

Composition of the Sn—Bi system solder particles at this time was Sn42/Bi58.

Blending ratios of the conductive adhesives prepared in Examples 16 to 20, Reference examples 1 to 2, and Comparative examples 13 to 16, and evaluation results of solder cohesiveness and evaluation results of squeegee life are shown in Tables 4 to 6.

The numerical values in fourth to fifth blocks from above in Tables 4 to 6 are weight percentages representing a ratio between adipic acid and glutaric acid.

TABLE 4

| | | Example 16 | Example 17 | Example 18 | Example 19 | Example 20 | Reference example 1 | Reference example 2 | Comparative example 13 | Comparative example 14 | Comparative example 15 | Comparative example 16 |
|---|---|---|---|---|---|---|---|---|---|---|---|---|
| Ration of solder particles | Solder particles No. 1 (particle size of 20 to 30 μm) (wt %) | 70 | 70 | 70 | 70 | 70 | 10 | 90 | 70 | 70 | 70 | 70 |
| | Solder particles No. 2 (particle size of 8 to 12 μm) (wt %) | 30 | 30 | 30 | 30 | 30 | 90 | 10 | 30 | 30 | 30 | 30 |
| Ration of organic | Adipic acid (wt %) | 10 | 20 | 33 | 40 | 50 | 33 | 33 | 91 | 51 | 100 | 0 |

TABLE 4-continued

|  |  | Example 16 | Example 17 | Example 18 | Example 19 | Example 20 | Reference example 1 | Reference example 2 | Comparative example 13 | Comparative example 14 | Comparative example 15 | Comparative example 16 |
|---|---|---|---|---|---|---|---|---|---|---|---|---|
| acid | Glutaric acid (wt %) | 90 | 80 | 67 | 60 | 50 | 67 | 67 | 9 | 49 | 0 | 100 |
| Evaluation of solder cohesiveness | | ○ | ◎ | ◎ | ◎ | ○ | ◎ | ○ | ○ | X | X | ○ |
| Evaluation of squeegee life | | ○ | ○ | ○ | ○ | ○ | ○ | ○ | X | ○ | ○ | X |

Note)
As to Evaluation of solder cohesiveness
Mark ○: Mark ○ represents acceptance in solder cohesiveness when the third metal mask is used.
Mark ◎: Mark ◎ represents acceptance in solder cohesiveness when the third metal mask and the fourth metal mask are used.
Note)
As to evaluation of squeegee life
Mark ○: Mark ○ represents that a value of $\sigma_{24}/\sigma_0$ is 1 to 1.2 or less.

In Examples 16 to 20, evaluation of solder cohesiveness (using a third metal mask, and a fourth metal mask) and evaluation of squeegee life were executed while varying the ratio between adipic acid and glutaric acid used as organic acid (see Table 4).

In Example 16, with respect to 10 wt % of adipic acid, the remainder was occupied by glutaric acid, and the solder cohesiveness and the squeegee life were evaluated, and results of acceptance can be obtained in both evaluations (see Table 4).

Herein, in Tables 4 to 6, the mark ○ represents acceptance in solder cohesiveness when the third metal mask is used, and the mark ◎ represents acceptance in solder cohesiveness when the third metal mask and the fourth metal mask are used, and the mark x represents rejection. Meanwhile, in Tables 4 to 6, since evaluation of squeegee life is independent of the size of the opening of the metal mask, an accepted case is denoted by the mark ○, and a rejected case is denoted by the mark x.

Further, even when the remainder was occupied by glutaric acid with respect to 50 wt % of adipic acid, a result similar to that of Example 6 was able to be obtained (see Example 20).

Obviously, when the remainder was occupied by glutaric acid with respect to 33 wt % of adipic acid, a result of acceptance was obtained (see Example 18). In Example 18, in particular, a result of acceptance was obtained also in evaluation of solder cohesiveness using the fourth metal mask.

A result similar to that of Example 18 was obtained when the remainder was occupied by glutaric acid with respect to 20 wt % of adipic acid, and when the remainder was occupied by glutaric acid with respect to 40 wt % of adipic acid (see Examples 17, 19).

Next, as a reference example, an adhesive containing organic acid was prepared from 33 wt % of adipic acid and the remainder of glutaric acid, and 82 wt % of solder particles was put into 18 wt % of the adhesive to prepare a conductive adhesive.

At this time, the ratio between solder particles No. 1 and solder particles No. 2 was varied, and a conductive adhesive was prepared for each of the case containing 10 wt % of solder particles No. 1 and the remainder of solder particles No. 2 (see Reference example 1), and the case containing 90 wt % of solder particles No. 1 and the remainder of solder particles No. 2 (see Reference example 2), and the solder cohesiveness and the squeegee life were evaluated, and results of acceptance were obtained in both cases (see Table 4).

As described above, in the present embodiment, the organic acid was composed of two kinds, adipic acid and glutaric acid so as not to prevent the reaction with the solder particles from progressing. The ratio is such that adipic acid occupies 10 to 50 wt % and the remainder is occupied by glutaric acid.

By employing this ratio, it was possible to prevent the reaction between organic acid and the solder particles, and to ensure the solder cohesiveness and the squeegee life.

Here, for better understanding of the above effect of the present embodiment, the result confirmed by the present inventors regarding the reaction between organic acid (dibasic acid) and the solder particles, for the conductive adhesive of Patent Document 1 described above will be described.

That is, in Patent Document 1, the soldering performance is ensured as far as after producing the conductive adhesive, the conductive adhesive is printed on a printed circuit board in a predetermined time (for example, in 24 hours), and then a solder melting step is executed immediately. However, the inventors of the present application confirmed that in the case of Patent Document 1, the bibasic acid dissolved in epoxy resin or a curing agent gradually reacts with the solder particles after production of the conductive adhesive to form a salt.

Consequently, as the first problem, it was confirmed that when the conductive adhesive is printed after such reaction has progressed over a certain extent, the organic acid (bibasic acid) fails to act as acid in executing the solder melting step, and the solder dose not wetly spread on the metal part, so that the soldering performance cannot be ensured.

Further, as the second problem, the salt formed by reaction between the organic acid (bibasic acid) and the solder particles reacts with epoxy resin because it has strong nucleophilicity. Therefore, it was confirmed that squeegee life in printing and long-term storage stability cannot be ensured. In other words, it was confirmed that the term in which the soldering performance can be ensured in shipping or using at a customer's site after production of the conductive adhesive is limited in the case of Patent Document 1.

As is apparent from the above description, according to the conductive adhesive of the present embodiment, since the reaction between the organic acid and the solder particles can be prevented, the first and the second problems as in Patent Document 1 do not arise.

Now, we resume description of Comparative examples of the present embodiment.

As Comparative example 13, when 91 wt % of adipic acid and the remainder of glutaric acid were used, a result of acceptance was obtained in evaluation of solder cohesiveness, however, it was revealed that a result in evaluation of squeegee life is inferior to Examples 16 to 20, and is rejected. In other words, increase in viscosity was observed (see Table 4).

A result of analysis for the cause of the above is as follows.

The conductive adhesive placed on the metal mask at the time of evaluation of squeegee life absorbs moisture in the air, and glutaric acid is dissolved in moisture in the material. Therefore, it seems that glutaric acid unnecessarily acts as acid on the metal mask, and causes progression of the reaction between solder and acid, resulting in evaluation of rejection in squeegee life. It is actually known that glutaric acid is dissolved in an aqueous solution of 20° C. at 38.7%, and adipic acid is dissolved at 1.5%.

Next, in Comparative example 14, the ratio between adipic acid and glutaric acid was set at 51 wt % of adipic acid and 49 wt % of glutaric acid, and evaluation was made, and the result of evaluation of solder cohesiveness was rejection (see Table 4). It seems that this is attributable to the fact that the melting point of adipic acid is higher than that of the Sn—Bi system solder particle as is evidenced from the melting point of adipic acid of 152° C. and the melting point of glutaric acid of 97° C., in comparison with the melting point of Sn—Bi system solder of 138° C.

It seems that this reveals that the acid required until the solder melts and coheres is not supplied from adipic acid because adipic acid is dissolved and acts as acid after the solder melts at the time of heating the material.

For confirmation, in Comparative examples 15 and 16, evaluation of solder cohesiveness and evaluation of squeegee life by adipic acid, or glutaric acid alone were made (see Table 4).

Next, as shown in Table 5, with respect to 18 wt % of the adhesive containing organic acid, the remainder of 82 wt % was occupied by the solder particles, and in the solder particles, Sn—Bi system solder particles No. 1 occupied 60 wt % and Sn—Bi system solder particles No. 2 occupied 40 wt %, to prepare a desired conductive adhesive, and evaluation of solder cohesiveness and evaluation of squeegee life were executed (see Examples 21 to 25 in Table 5).

TABLE 5

|  |  | Example 21 | Example 22 | Example 23 | Example 24 | Example 25 |
|---|---|---|---|---|---|---|
| Ration of solder particles | Solder particles No. 1 (particle size of 20 to 30 μm) (wt %) | 60 | 60 | 60 | 60 | 60 |
|  | Solder particles No. 2 (particle size of 8 to 12 μm) (wt %) | 40 | 40 | 40 | 40 | 40 |
| Ration of organic acid | Adipic acid (wt %) | 10 | 20 | 33 | 40 | 50 |
|  | Glutaric acid (wt %) | 90 | 80 | 67 | 60 | 50 |
| Evaluation of solder cohesiveness |  | ○ | ◎ | ◎ | ◎ | ○ |
| Evaluation of squeegee life |  | ○ | ○ | ○ | ○ | ○ |

Note)
As to Evaluation of solder cohesiveness

Mark ○: Mark ○ represents acceptance in solder cohesiveness when the third metal mask is used.

Mark ◎: Mark ◎ represents acceptance in solder cohesiveness when the third metal mask and the fourth metal mask are used.

Note)
As to evaluation of squeegee life

Mark ○: Mark ○ represents that a value of $o_{24}/o_0$ is 1 to 1.2 or less.

Also in the cases of Examples 21 to 25, the results similar to those of Examples 16 to 20 were obtained. In Examples 22 to 24, in particular, a result of acceptance was obtained also in evaluation of solder cohesiveness using the fourth metal mask.

Next, as shown in Table 6, with respect to 18 wt % of the adhesive containing organic acid, the remainder of 82 wt % was occupied by the solder particles, and in the solder particles, Sn—Bi system solder particles No. 1 occupied 80 wt % and Sn—Bi system solder particles No. 2 occupied 20 wt %, to prepare a desired conductive adhesive, and evaluation of solder cohesiveness and evaluation of squeegee life were executed (see Examples 26 to 30 in Table 6).

TABLE 6

|  |  | Example 26 | Example 27 | Example 28 | Example 29 | Example 30 |
|---|---|---|---|---|---|---|
| Ration of solder particles | Solder particles No. 1 (particle size of 20 to 30 μm) (wt %) | 80 | 80 | 80 | 80 | 80 |
|  | Solder particles No. 2 (particle size of 8 to 12 μm) (wt %) | 20 | 20 | 20 | 20 | 20 |
| Ration of organic acid | Adipic acid (wt %) | 10 | 20 | 33 | 40 | 50 |
|  | Glutaric acid (wt %) | 90 | 80 | 67 | 60 | 50 |
| Evaluation of solder cohesiveness |  | ○ | ◉ | ◉ | ◉ | ○ |
| Evaluation of squeegee life |  | ○ | ○ | ○ | ○ | ○ |

Note)
As to Evaluation of solder cohesiveness
Mark ○: Mark ○ represents acceptance in solder cohesiveness when the third metal mask is used.
Mark ◉: Mark ◉ represents acceptance in solder cohesiveness when the third metal mask and the fourth metal mask are used.
Note)
As to evaluation of squeegee life
Mark ○: Mark ○ represents that a value of $\sigma_{24}/\sigma_0$ is 1 to 1.2 or less.

Also in the cases of Examples 26 to 30, the results similar to those of Examples 16 to 20 were obtained. In Examples 27 to 29, in particular, a result of acceptance was obtained also in evaluation of solder cohesiveness using the fourth metal mask.

These results revealed that excellent printing form is obtained and results of acceptance are obtained in both evaluation of solder cohesiveness and evaluation of squeegee life, when the proportion of solder particles No. 1 is 40 to 90 wt %, and the remainder is occupied by solder particles No. 2, and the ratio between adipic acid and glutaric acid is such that adipic acid occupies 10 to 50 wt % and the remainder is occupied by glutaric acid in the conductive adhesive of the present embodiment.

It was also revealed that more preferably the proportion of solder particles No. 1 is 60 to 80 wt %, and the remainder is occupied by solder particles No. 2, and the ratio between adipic acid and glutaric acid is such that adipic acid occupies 20 to 40 wt % and the remainder is occupied by glutaric acid.

Third Embodiment (Size of Organic Acid)

In the third embodiment, the sizes of the particles of organic acid constituting the adhesive containing organic acid will be examined.

Herein, the blending ratio of the adhesive containing organic acid and the stirring step used in the present embodiment are similar to those described in the first embodiment, and thus the description thereof will be omitted.

The ratio between adipic acid and glutaric acid contained in the organic acid of the present embodiment was 33 wt % of adipic acid and 67 wt % of glutaric acid.

Then, with respect to 18 wt % of the adhesive containing organic acid obtained in the above stirring step, the remainder of 82 wt % was occupied by the Sn—Bi system solder particles. And in the Sn—Bi system solder particles, Sn—Bi system solder particles No. 1 occupied 70 wt % and Sn—Bi system solder particles No. 2 occupied 30 wt % in order to prepare a desired conductive adhesive.

Composition of the Sn—Bi system solder particles at this time was Sn42/Bi58.

Blending ratios of the conductive adhesives prepared in Examples 31 to 34 and Comparative examples 17 to 18, and evaluation results of solder cohesiveness and evaluation results of squeegee life are shown in Table 7.

Herein, in evaluation of solder cohesiveness of the third embodiment, only evaluation using the third metal mask was conducted.

The numerical value in the fourth block from above in Table 7 represents a proportion (%) of the amount of particles having a particle size of 10 μm or less of active agent (organic acid) with respect to the amount of the whole particles in the particle size distribution of organic acid particles.

TABLE 7

|  | Example 31 | Example 32 | Example 33 | Example 34 | Comparative example 17 | Comparative example 18 |
|---|---|---|---|---|---|---|
| Solder particles No. 1(particle size of 20 to 30 μm) (wt %) | 70 | 70 | 10 | 90 | 70 | 70 |
| Solder particles No. 2(particle size of 8 to 12 μm) (wt %) | 30 | 30 | 90 | 10 | 30 | 30 |
| Proportion(%) of the amount of particles having a particle size of 10 μm or less of organic acid with respect to the amount of | 5 | 70 | 70 | 70 | 4 | 71 |

TABLE 7-continued

|  | Example 31 | Example 32 | Example 33 | Example 34 | Comparative example 17 | Comparative example 18 |
|---|---|---|---|---|---|---|
| the whole particles in the particle size distribution of organic acid particles |  |  |  |  |  |  |
| Evaluation of solder cohesiveness | ○ | ○ | ○ | ○ | X | ○ |
| Evaluation of squeegee life | ○ | ○ | ○ | ○ | ○ | X |

As to grinding of organic acid, organic acid having a desired size was prepared by adjusting the grinding time using an absolute mill available from Osaka Chemical Co., Ltd.

The sizes of the particles of organic acid (adipic acid and glutaric acid) used in the conductive adhesive of the present invention were examined.

Further, in the conductive adhesive of the present invention composed of an adhesive containing organic acid and solder particles, for the purpose of filling the solder particles having a size of 20 to 30 μm with particles having a different particle size as organic acid, and for the purpose of ensuring a large contact area between organic acid and solder particles having two kinds of particle sizes, we expected that the size of organic acid is preferably 10 μm or less, and evaluated.

When the proportion (%) of the amount of particles having a particle size of 10 μm or less was 5 to 70% with respect to the amount of the whole particles in the particle size distribution of particles of organic acid, results of acceptance were able to be obtained in both evaluation of solder cohesiveness and evaluation of squeegee life (see Examples 31, 32 in Table 7).

Next, evaluations similar to those described above were conducted for the case where solder particles No. 1 occupy 10 wt % and the remainder is occupied by solder particles No. 2 (see Example 33 in Table 7), and the case where solder particles No. 1 occupy 90 wt %, and the remainder is occupied by solder particles No. 2 (see Example 34 in Table 7) regarding the ratio of solders of two kinds of particle sizes in 82 wt % of solder particles, and results of acceptance was able to be obtained likewise Example 31 (see Examples 33, 34 in Table 7).

However, when the proportion (%) of the amount of particles having a particle size of 10 μm or less was 4% with respect to the amount of the whole particles in the particle size distribution of particles of organic acid, a result of acceptance was obtained in evaluation of squeegee life, however, a result of rejection was obtained in evaluation of solder cohesiveness (see Comparative example 17 in Table 7).

This indicates that as a result of increase in proportion of the particles of organic acid having large particle sizes, relative to solder particles used in the conductive adhesive of the present invention, there is no effect on a solder having a small particle size of solder particles. This is because the smaller the particle size of the solder particles is, the larger the substantial surface area of the whole solder particles is, and plenty of oxide films exist. Therefore, this indicates that an active agent having a large particle size (organic acid) is less likely to act as organic acid because the surface area of the active agent itself is also reduced.

Next, evaluation was conducted when the proportion (%) of the amount of particles having a particle size of 10 μm or less was 71% with respect to the amount of the whole particles in the particle size distribution of particles of organic acid.

As a result, by using the particles of organic acid in which the proportion (%) of the amount of particles having a particle size of 10 μm or less was 71% with respect to the amount of the whole particles in the particle size distribution of organic acid particles, a result of acceptance was maintained for the solder cohesiveness, however, it exerted an adverse affect on evaluation of squeegee life to lead a result of rejection (see Comparative example 18 in Table 7).

It seems that this is attributable to the fact that when the proportion of the particle amount having a particle size of 10 μm or less in the particles of organic acid is too large, the conductive adhesive of the present invention absorbs moisture in the air when it is placed on a metal mask, and finely ground glutaric acid is first dissolved in the absorbed moisture, and acts as acid unnecessarily on the metal mask, so that the reaction between the solder and the acid is progressed, and consequently evaluation of squeegee life is deteriorated.

These results revealed that for satisfying both the solder cohesiveness and the squeegee life, the sizes of the particles of organic acid (adipic acid and glutaric acid) used in the conductive adhesive of the present invention is preferably 10 μm or less, and the proportion of the amount of particles having a particle size of 10 μm or less is preferably 5 to 70% with respect to the amount of the whole particles in the particle size distribution of particles of organic acid.

Further, according to the present embodiment, it is possible to fill resin with solder particles and organic acid efficiently, and to ensure the printing performance, the solder cohesiveness, and the squeegee life performance for an electronic circuit board having a land pattern of a fine pitch.

In other words, it was revealed that for satisfying both the printing performance, the solder cohesiveness, and the squeegee life performance, not only the blending ratio of organic acid, but also the sizes of particles of organic acid, and the size of solder particles should be managed.

Fourth Embodiment (Solder Composition)

In the fourth embodiment, an alloy composition of a Sn—Bi system solder will be examined.

Herein, the blending ratio of the adhesive containing organic acid and the stirring step used in the present embodiment are similar to those described in the first embodiment, and thus the description thereof will be omitted.

The ratio between adipic acid and glutaric acid contained in the organic acid of the present embodiment was 33 wt % of adipic acid and 67 wt % of glutaric acid likewise the third embodiment.

Then, with respect to 18 wt % of the adhesive containing organic acid obtained in the above stirring step, the remainder of 82 wt % was occupied by the Sn—Bi system solder particles. And in the Sn—Bi system solder particles, Sn—Bi system solder particles No. 1 occupied 70 wt % and Sn—Bi system solder particles No. 2 occupied 30 wt % in order to prepare a desired conductive adhesive.

Blending ratios of the conductive adhesives prepared in Examples 3, 35, and 36, and evaluation results of solder cohesiveness and evaluation results of squeegee life are shown in Table 8.

Herein, in evaluation of solder cohesiveness of the third embodiment, only evaluation using the third metal mask was conducted.

TABLE 8

|  | Example 3 | Example 35 | Example 36 |
|---|---|---|---|
| Solder composition | Sn42/Bi58 | Sn42/Bi57/Ag1.0 | Sn16/Bi56/In28 |
| Solidus line (° C.) | 139 | 138 | 78 |
| Evaluation of solder cohesiveness | ◯ | ◯ | ◯ |
| Evaluation of squeegee life | ◯ | ◯ | ◯ |

Regarding the conductive adhesive of the present invention, a solder composition was examined in the manner as shown in the first to third embodiments.

As a result, in the solder composition of Sn42/Bi58 shown in the first embodiment, results of acceptance were obtained in both evaluation of solder cohesiveness and evaluation of squeegee life (see Example 3 in Table 8).

Likewise this, evaluation of solder cohesiveness and evaluation of squeegee life were conducted using solder powder having a solder composition of Sn42/Bi57/Ag1.0 (42 weight % Sn-57 weight % Bi-1.0 weight % Ag) as the Sn—Bi system solder powder, and a result similar to that of Example 3 was obtained (see Example 35 in Table 8).

Also, evaluation of solder cohesiveness and evaluation of squeegee life were conducted using solder powder having a solder composition of Sn16/Bi56/In28 (16 weight % Sn-56 weight % Bi-28 weight % In), and a result similar to that of Example 3 was obtained (see Example 36 in Table 8).

The foregoing indicates that as the solder powder of the conductive adhesive of the present invention, each solder powder having a solder composition of any one of Sn42/Bi58, Sn42/Bi57/Ag1.0, and Sn16/Bi56/In28 is applicable, and reveals that such a solder composition is useful that a value of solder solidus line is between the melting point of adipic acid and the melting point of glutaric acid as organic acid, or not higher than these melting points.

Fifth Embodiment (Conductive Part Formed with the Conductive Adhesive)

In the fifth embodiment, we examined formation of a conductive part using the conductive adhesive of the present invention.

Herein, the blending ratio of the adhesive containing organic acid and the stirring step used in the present embodiment are similar to those described in the first embodiment, and thus the description thereof will be omitted.

Then, with respect to 18 wt % of the adhesive containing organic acid obtained in the above stirring step, the remainder of 82 wt % was occupied by the Sn—Bi system solder particles. And in the Sn—Bi system solder particles, Sn—Bi system solder particles No. 1 occupied 70 wt % and Sn—Bi system solder particles No. 2 occupied 30 wt % in order to prepare a desired conductive adhesive.

Composition of the Sn—Bi system solder particles at this time was Sn42/Bi58.

Figure 2A:
FIGS. 2A to 2C are schematic sectional views showing a production method of a conductive part formed using a conductive adhesive in a fifth embodiment of the present invention.
Figure 2B:
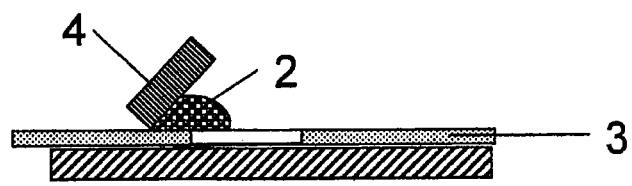
Figure 2C:
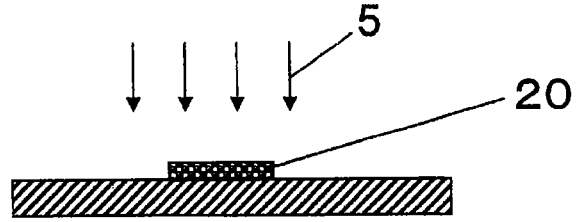

FIGS. 2A to 2C show a production method of an electronic circuit board according to the fifth embodiment in the present invention.

First, a base plate 1 shown in FIG. 2A is prepared. As the base plate 1, a base plate composed of polyethylene terephthalate, polyethylene naphtharate, polycarbonate, polyimide, thermoplasitc resin, epoxy, thermosetting resin, aramid non-woven fabric, glass woven fabric, glass nonwoven fabric or the like may be used, without limited to these.

Next, as shown in FIG. 2B, using a conductive adhesive 2 according to the fifth embodiment, a circuit pattern is drawn on surface of the base plate 1 by a metal mask 3 and a squeegee 4. As the method of drawing, besides the screen printing, various methods such as inkjet, dispenser, impregnation, spin coat, and the like may be used.

Next, as shown in FIG. 2C, heat 5 or ultraviolet rays, electronic rays, or the like is caused to act on a circuit pattern 20 to cure the conductive adhesive. By the above method, it is possible to produce a conductive part according to the firth embodiment as described above.

Note that, the circuit pattern 20 is one example of a conductive part of the present invention.

Conventionally, as a representative of the conductive adhesives used in a conductive part formed with a conductive adhesive, Ag system conductive adhesives are recited, however, the Ag system conductive adhesives exhibit high contact resistance, and are accompanied by a problem of occurrence of migration, and hence development of an alternative is demanded.

In the case of an Ag system conductive adhesive, the contact resistance is high because conduction is achieved by neighboring of Ag particles as a result of curing constriction at the time of curing of the resin, and hence the electric resistance is relatively high, and it does not have self-alignment property because Ag particles are not melted.

Further, the problem of migration arises that the circuit is eroded by the acid acting as a reducing agent on surface of Ag particles at the time of curing of the resin.

In addition to the above, an Ag system conductive adhesive cannot be used for surface mounting because its curing temperature is 100 to 300° C., and its curing time is as long as 10 to 180 minutes.

Accordingly, since the conductive adhesive according to the present invention composed of an adhesive containing organic acid and solder particles has a curing temperature of 150 to 170° C., and a curing time of as short as 4 to 8 minutes, and expresses self alignment property by melting of the solder, stable electric resistance can be obtained, and acid is consumed at the time of melting, resulting that the fear of erosion of circuit and migration is cleared.

Sixth Embodiment (Multilayer Circuit Board Formed with the Conductive Adhesive)

In the sixth embodiment, we examined formation of a multilayer circuit board using the conductive adhesive of the present invention.

Herein, the blending ratio of the adhesive containing organic acid and the stirring step used in the present embodiment are similar to those described in the first embodiment, and thus the description thereof will be omitted.

Then, with respect to 18 wt % of the adhesive containing organic acid obtained in the above stirring step, the remainder of 82 wt % was occupied by the Sn—Bi system solder particles. And in the Sn—Bi system solder particles, Sn—Bi system solder particles No. 1 occupied 70 wt % and Sn—Bi system solder particles No. 2 occupied 30 wt % in order to prepare a desired conductive adhesive.

Composition of the Sn—Bi system solder particles at this time was Sn42/Bi58.

FIGS. 3A to 3D show a production method of a multilayer circuit board according to the sixth embodiment in the present invention.

Figure 3A:
FIGS. 3A to 3D are schematic sectional views showing a production method of a multilayer circuit board formed using a conductive adhesive in a sixth embodiment of the present invention.

First, a base plate 10 having a through hole at a given position as shown in FIG. 3A is prepared. As the base plate 10, a base plate composed of polyethylene terephthalate, polyethylene naphtharate, polycarbonate, polyimide, thermoplasitc resin, epoxy, thermosetting resin, aramid nonwoven fabric, glass woven fabric, glass nonwoven fabric, or the like may be used, without limited to these.

The through hole 6 may be formed by machining using a drill or a puncher, or heat processing using laser or the like.

Figure 3B:
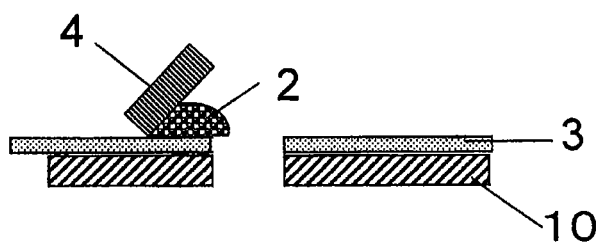
Figure 3C:

Next, as shown in FIG. 3B, the through hole 6 is filled with the conductive adhesive 2 using the metal mask 3 and the squeegee 4 (FIG. 3C). As a filling method, besides the screen printing similar to that described in FIG. 2B, various methods such as inkjet, dispenser, impregnation, spin coat, and the like may be used.

Figure 3D:
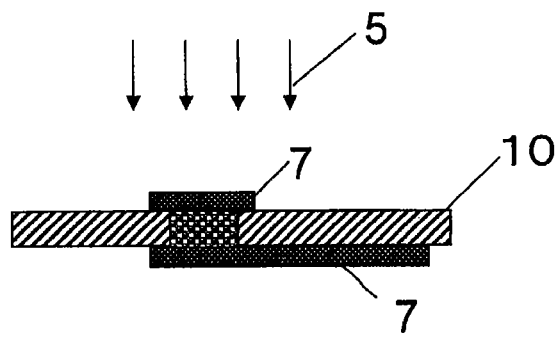

Next, using screen printing, a circuit pattern 7 is formed as shown in FIG. 3D. For formation of the circuit pattern 7, the method of the fifth embodiment described above, or a general circuit pattern forming method may be used.

As shown in FIG. 3D, heat 5 or ultraviolet rays, electronic rays, or the like is caused to act on a circuit pattern 7 to cure the conductive adhesive. By the above method, it is possible to produce a multilayer circuit board according to the sixth embodiment as described above.

Conventionally, as a representative of the conductive adhesives used in a conductive part formed with a conductive adhesive, Ag system conductive adhesives are recited, however, the Ag system conductive adhesives exhibit high contact resistance, and are accompanied by a problem of occurrence of migration, and hence development of an alternative is demanded.

In the case of an Ag system conductive adhesive, the contact resistance is high because conduction is achieved by neighboring of Ag particles as a result of curing constriction at the time of curing of the resin, and hence the electric resistance is relatively high, and it does not have self-alignment property because Ag particles are not melted.

Further, the problem of migration arises that the circuit is eroded by the acid acting as a reducing agent on surface of Ag particles at the time of curing of the resin.

In addition to the above, an Ag system conductive adhesive cannot be used for surface mounting because its curing temperature is 100 to 300° C., and its curing time is as long as 10 to 180 minutes.

Accordingly, since the conductive adhesive according to the present invention composed of an adhesive containing organic acid and solder particles has a curing temperature of 150 to 170° C., and a curing time of as short as 4 to 8 minutes, and expresses self alignment property by melting of the solder, stable electric resistance can be obtained, and acid is consumed at the time of melting, resulting that the fear of erosion of circuit and migration is cleared.

Seventh Embodiment(Electronic Component Module Soldered by Using the Conductive Adhesive)

In the seventh embodiment, we examined soldering and forming an electronic component module using the conductive adhesive of the present invention.

Herein, the blending ratio of the adhesive containing organic acid and the stirring step used in the present embodiment are similar to those described in the first embodiment, and thus the description thereof will be omitted. [0170]

Then, with respect to 18 wt % of the adhesive containing organic acid obtained in the above stirring step, the remainder of 82 wt % was occupied by the Sn—Bi system solder particles. And in the Sn—Bi system solder particles, Sn—Bi system solder particles No. 1 occupied 70 wt % and Sn—Bi system solder particles No. 2 occupied 30 wt % in order to prepare a desired conductive adhesive.

Composition of the Sn—Bi system solder particles at this time was Sn42/Bi58.

FIGS. 4A to 4D show a production method of an electronic component module according to the seventh embodiment in the present invention.

Figure 4A:
FIGS. 4A to 4D are schematic sectional views of a production method of an electronic component module joined with a conductive adhesive in a seventh embodiment of the present invention.

First, an electronic circuit board 8 shown in FIG. 4A is prepared. As the electronic circuit board 8, a commonly available electronic circuit board may be used.

Figure 4B:
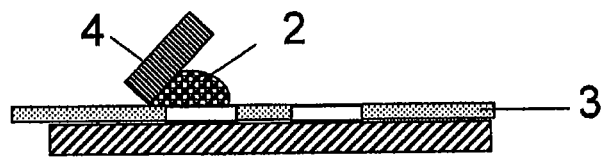
Figure 4C:
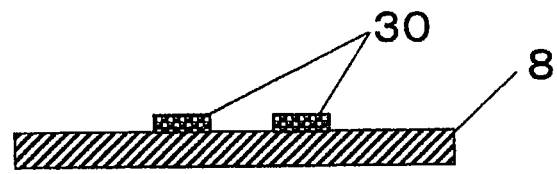

Next, as shown in FIG. 4B, the conductive adhesive 2 according to the seventh embodiment is applied on surface of the electronic circuit board 8. As an applying method, besides the screen printing similar to that described in FIG. 2B, various methods such as inkjet, dispenser, impregnation, spin coat, and the like may be used. In this manner, a circuit pattern 30 is formed (FIG. 4C).

Figure 4D:
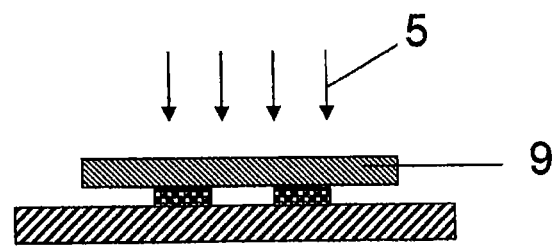

Next, an electronic component 9 is mounted as shown in FIG. 4D.

Next, as shown in FIG. 4D, heat 5 or ultraviolet rays, electronic rays, or the like is caused to act on an applied part of the conductive adhesive 2. Then the conductive adhesive cures and fixes the electronic component. By the above method, it is possible to produce an electronic component module according to the seventh embodiment.

Accordingly, by using the conductive adhesive 2 in the present invention, it is possible to enhance the soldered part by junction between the electronic circuit board 8 and the electronic component 9 by the solder, and by the resin covering the periphery of the solder.

In other words, there arise an effect of greatly cutting down a soldered part protecting step, in contrast to a conventional process where protection of a soldered part by underfill is executed after soldering with a cream solder like Sn96.5/Ag3.0/Cu0.5. Further, since an electronic component can be mounted with low-temperature reflow soldering rather than with high-temperature reflow soldering of lead-free solder, the invention also contributes to resource saving.

Further, functions required for commercial products are diversified, and reduction in weight, thickness, length, and size is advanced in mobile devices such as a mobile phone or a digital camera. Also with respect to this, the low-temperature reflow soldering is able to reduce the bowing at the mounting of the thin plate, and leads improvement in printing performance at the time of double-sided mounting and improvement in a component mounting quality.

The present invention is not limited to the above examples, and it goes without saying that combination with other materials as generally contained in a conductive adhesive may be applicable even if it is not described in the above examples.

In the foregoing embodiments, description was made for the cases where adipic acid and glutaric acid are used as organic acid, however, glycolic acid (m.p. 141° C.), thiodiglycolic acid (m.p. 121° C.), sebacic acid (m.p. 134.4° C.) and the like may be used as an auxiliary active agent in addition to adipic acid and glutaric acid without limited to the above.

Industrial Applicability

The conductive adhesive of the present invention has an effect of ensuring the printing performance for a circuit board having a land of a much finer pitch, and is useful as a conductive adhesive for formation of electronic circuit, a conductive adhesive for mounting a component and the like.

REFERENCE SIGNS LIST

A to D: Solder particles No. 1
E: Solder particle No. 2

$L_1$: Diameter of solder particle No. 1
$L_2$: Diameter of solder particle No. 2
$L_3$: Particle-to-particle distance of solder particles No. 1
1, 10 Base plate
2 Conductive adhesive
3 Metal mask
4 Squeegee
5 Heat
6 Through hole
7, 20, 30 Circuit pattern
8 Electronic circuit board
9 Electronic component
100 Gap

What is claimed is:

1. A conductive adhesive comprising:
  82 wt % of Sn—Bi system solder powder and;
  18 wt % of an adhesive containing organic acid, wherein
  the Sn—Bi system solder powder is composed of solder particles having a particle size $L_1$ of 20 to 30 μm and solder particles having a particle size $L_2$ of 8 to 12 μm,
  the particle size $L_1$ is represented by a median diameter (D50) which is a particle size where an integrated particle amount is 50%,
  the particle size $L_2$ is represented by a median diameter (D50) which is a particle size where an integrated particle amount is 50%,
  a mixing ratio of the Sn—Bi system solder powder is such that the solder particles having the particle size $L_1$ of 20 to 30 μm occupy 70 wt % with respect to the whole solder powder, and 30 wt % is occupied by solder particles having the particle size $L_2$ of 8 to 12 μm,
  a solder composition of the Sn—Bi system solder powder is 42 wt % Sn-58 wt % Bi, and
  the adhesive containing organic acid is made up of 16 wt % of bisphenol A type epoxy resin, 62 wt % of bisphenol F type epoxy resin, 12 wt % of imidazole system curing agent, 3.0 wt % of adipic acid, 6.0 wt % of glutaric acid, and 1.0 wt % of thicking agent.

2. A circuit board comprising:
  a base plate; and
  a conductive part formed on the base plate comprising the conductive adhesive according to claim 1.

3. An electronic component module comprising:
  a circuit board;
  a conductive part formed on the circuit board comprising the conductive adhesive according to claim 1; and
  an electronic component mounted on the circuit board via the conductive part.

\* \* \* \* \*